United States Patent
Hishiro

(10) Patent No.: US 7,402,379 B2
(45) Date of Patent: Jul. 22, 2008

(54) RESIST EXPOSURE SYSTEM AND METHOD OF FORMING A PATTERN ON A RESIST

(75) Inventor: Yoshiki Hishiro, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 352 days.

(21) Appl. No.: 11/360,642

(22) Filed: Feb. 23, 2006

(65) Prior Publication Data

US 2006/0141397 A1 Jun. 29, 2006

Related U.S. Application Data

(62) Division of application No. 10/921,709, filed on Aug. 19, 2004, now Pat. No. 7,169,545, which is a division of application No. 10/216,340, filed on Aug. 9, 2002, now Pat. No. 6,875,552.

(51) Int. Cl.
*G03F 7/00* (2006.01)
(52) U.S. Cl. ............... 430/311; 430/270.1; 430/313; 430/330; 430/905; 430/907; 430/910; 430/945
(58) Field of Classification Search ............. 430/270.1, 430/311, 313, 330, 905, 907, 910, 945
See application file for complete search history.

(56) References Cited

U.S. PATENT DOCUMENTS

| | | | |
|---|---|---|---|
| 6,004,725 | A | 12/1999 | Barr et al. |
| 6,087,064 | A | 7/2000 | Lin et al. |
| 6,103,445 | A | 8/2000 | Willson et al. |
| 6,159,653 | A | 12/2000 | Malik et al. |
| 6,284,438 | B1 | 9/2001 | Choi et al. |
| 6,300,036 | B1 | 10/2001 | Choi et al. |
| 6,376,152 | B2 | 4/2002 | Kawabe et al. |
| 6,875,552 | B2 | 4/2005 | Hishiro |

OTHER PUBLICATIONS

"Metrology Supporting Deep Ultraviolet Lithography," http://www.eel.nist.gov, May 6, 2002, pp. 1-5.

T.S. Ravi, K. Konjuh, D. Mordo, K. MacWilliams, W.G.M Van Den Hoek, "PEARL(TM)-PECVD Anti-Reflective Layer for Sub 0.35 μm Lithography," Technical Paper, Novellus Systems, Inc., Dec. 1997.

*Primary Examiner*—Amanda C. Walke
(74) *Attorney, Agent, or Firm*—Dinsmore & Shohl LLP

(57) ABSTRACT

A resist exposure system and a method of forming a pattern on a resist are provided and include an exposure source, a photoresist composition, and a mask positioned therebetween. The resist composition comprises a first photoresist X and a second photoresist Y. The first photoresist X absorbs at a higher wavelength than the second photoresist Y. The second photoresist Y has a lower glass transitional temperature than the first photoresist X.

18 Claims, 2 Drawing Sheets

RESIST EXPOSURE SYSTEM AND METHOD OF FORMING A PATTERN ON A RESIST

CROSS REFERENCE TO RELATED APPLICATIONS

This application is a division of U.S. patent application Ser. No. 10/921,709 filed Aug. 19, 2004 which is a division of U.S. patent application Ser. No. 10/216,340 filed Aug. 9, 2002, now U.S. Pat. No. 6,875,552 issued Apr. 5, 2005.

BACKGROUND OF THE INVENTION

The present invention relates to photoresist compositions and more particularly to an improved photoresist composition and its method of formation, a resist exposure system utilizing the improved photoresist, a method of forming a pattern on the improved photoresist, a method of forming a patterned semiconductor wafer, and a patterned semiconductor wafer formed in a process utilizing the improved photoresist.

There is a continuing drive in the art of photolithography to increase the contrast and resolution of an exposure process. The present inventors have recognized that photoresist properties play an important role in improving this contrast and resolution and that there is a need for photoresist compositions that are well-suited for use in high resolution, high contrast applications.

There is also a continuing drive in the art of photolithography to reduce process cost. The present inventors have also recognized that photoresist compositions can play an important role in containing or reducing these costs and that there is a need in the art for photoresist compositions that address this need.

BRIEF SUMMARY OF THE INVENTION

These needs are met by the present invention which provides an improved photoresist composition and its method of formation, a resist exposure system utilizing the improved photoresist, a method of forming a pattern on the improved photoresist, a method of forming a patterned semiconductor wafer, and a patterned semiconductor wafer formed in a process utilizing the improved photoresist.

In one embodiment of the present invention, a photoresist composition is provided comprising a combination of a first photoresist X and a second photoresist Y, wherein the first photoresist X is characterized by a first glass transition temperature, the second photoresist Y is characterized by a second glass transition temperature, second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength; and the second wavelength is substantially shorter than the first wavelength.

In another embodiment of the present invention, a photoresist composition is provided comprising a combination of a first photoresist X and a second photoresist Y, wherein the first photoresist X is characterized by a first glass transition temperature, the second photoresist Y is characterized by a second glass transition temperature, second glass transition temperature is lower than the first glass transition temperature, the first photoresist X is characterized by an absorption spectrum exhibiting an operational absorption of about 248 nm, and the second photoresist Y is characterized by an absorption spectrum exhibiting an operational absorption of about 193 nm.

In yet another embodiment of the present invention, a photoresist composition is provided comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption of about 193 nm, and the second photoresist Y is characterized by an absorption spectrum exhibiting an operational absorption of about 157 nm.

In another embodiment of the present invention, a photoresist composition is provided comprising a combination of a first photoresist X and a second photoresist Y, wherein the first photoresist X is characterized by a first glass transition temperature, the second photoresist Y is characterized by a second glass transition temperature, the second glass transition temperature is lower than said first glass transition temperature by an amount sufficient to enhance a characteristic mobility of the photoresist composition relative to a photoresist composition including only said first photoresist X, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than the first wavelength. The photoresist composition may exhibit a characteristic mobility that is enhanced at a temperature of about 130° C. The characteristic mobility of the first glass transition temperature may be enhanced at a temperature between about 130° C. and about 200° C.

In another embodiment of the present invention, a photoresist composition is provided comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, the second wavelength is substantially shorter than the first wavelength, and the second photoresist Y is provided in the photoresist composition in an amount sufficient to enhance a characteristic mobility of the photoresist composition relative to a photoresist composition including only the first photoresist X. Many of the photoresist compositions of the present invention are particularly well suited for reducing side-wall roughness in photolithography. Specifically, it is contemplated that the combination of photoresist X and photoresist Y wherein photoresist X absorbs in the vicinity of a higher wavelength than photoresist Y and photoresist Y has a lower glass transition temperature, contributes to increased mobility in the ultimate photoresist composition permitting the photoresist composition to be smoother, thereby reducing standing wave and side-wall roughness.

In another embodiment of the present invention, a resist exposure system is provided comprising a semiconductor wafer, a photoresist composition formed over the semiconductor wafer, the photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than the first wavelength, an exposure source configured to emit radiation of the first wavelength, and a mask positioned between the exposure source and the photoresist composition, wherein the mask defines an exposure pattern including portions having relatively high transmission at the first wavelength and portions having relatively low transmission at the first wavelength. The exposure source may comprise a laser. The exposure source may comprise an excimer laser.

In another embodiment of the present invention, a resist exposure system is provided comprising a semiconductor wafer, a photoresist composition formed over said semiconductor wafer, the photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than said first glass transition temperature, the first photoresist X is characterized by an absorption spectrum exhibiting an operational absorption of about 248 nm, and the second photoresist Y is characterized by an absorption spectrum exhibiting an operational absorption of about 193 nm, an exposure source configured to emit radiation of about 248 nm, and a mask positioned between the exposure source and the photoresist composition, wherein the mask defines an exposure pattern including portions having relatively high transmission at about 248 nm and portions having relatively low transmission at about 248 nm.

In another embodiment of the present invention, a resist exposure system is provided comprising a semiconductor wafer, a photoresist composition formed over the semiconductor wafer, the photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than said first glass transition temperature, the first photoresist X is characterized by an absorption spectrum exhibiting an operational absorption of about 193 nm, and the second photoresist Y is characterized by an absorption spectrum exhibiting an operational absorption of about 157 nm, an exposure source configured to emit radiation of about 193 nm, and a mask positioned between the exposure source and the photoresist composition, wherein the mask defines an exposure pattern including portions having relatively high transmission at about 193 nm and portions having relatively low transmission at about 193 nm.

In another embodiment of the present invention, a resist exposure system is provided comprising a semiconductor wafer, a photoresist composition formed over the semiconductor wafer, the photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than said first glass transition temperature by an amount sufficient to enhance a characteristic mobility of the photoresist composition relative to a photoresist composition including only the first photoresist X, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than said first wavelength, an exposure source configured to emit radiation of the first wavelength, and a mask positioned between the exposure source and the photoresist composition, wherein the mask defines an exposure pattern including portions having relatively high transmission at the first wavelength and portions having relatively low transmission at the first wavelength.

In another embodiment of the present invention, a resist exposure system is provided comprising a semiconductor wafer, a photoresist composition formed over the semiconductor wafer, the photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, the second wavelength is substantially shorter than the first wavelength, and the second photoresist Y is provided in the photoresist composition in an amount sufficient to enhance a characteristic mobility of the photoresist composition relative to a photoresist composition including only the first photoresist X, an exposure source configured to emit radiation of said first wavelength, and a mask positioned between said exposure source and the photoresist composition, wherein the mask defines an exposure pattern including portions having relatively high transmission at the first wavelength and portions having relatively low transmission at the first wavelength.

In another embodiment of the present invention, a method of forming a photoresist composition having an absorption spectrum in the vicinity of a first wavelength is provided comprising providing a first photoresist X, wherein the first photoresist X is characterized by a first glass transition temperature and an absorption spectrum exhibiting an operational absorption in the vicinity of a first wavelength, providing a second photoresist Y, wherein the second photoresist Y is characterized by a second glass transition temperature which is lower than the first glass transition temperature and an absorption spectrum exhibiting an operational absorption in the vicinity of a second wavelength relative to a photoresist composition including only the first photoresist X, and combining the first photoresist X with the second photoresist Y.

In another embodiment of the present invention, a method of forming a pattern on a photoresist is provided comprising the steps of: i) providing a photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than the first wavelength; and (ii) exposing the photoresist composition to a patterned light source configured to emit radiation at the first wavelength to form an exposed photoresist composition.

In another embodiment of the present invention, a method of forming a pattern on a photoresist is provided comprising the steps of: i) providing a photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption of about 248 nm, and the second photoresist Y is characterized by an absorption spectrum exhibiting an operational absorption of about 193 nm; and ii) exposing the photoresist composition to a patterned light source configured to emit radiation at about 248 nm to form an exposed photoresist composition.

In another embodiment of the present invention, a method of forming a pattern on a photoresist is provided comprising the steps of: i) providing a photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption of about 193 nm, and the second photoresist Y is characterized by an absorption spectrum exhibiting an operational absorption of about 157 nm; and ii) exposing the photoresist composition to a patterned light source configured to emit radiation at about 193 nm to form an exposed photoresist composition.

In another embodiment of the present invention, a method of forming a pattern on a photoresist is provided comprising the steps of: i) providing a photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature by an amount sufficient to enhance a characteristic mobility of the photoresist composition relative to a photoresist composition including only said first photoresist X, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than the first wavelength; and ii) exposing the photoresist composition to a patterned light source configured to emit radiation at the first wavelength to form an exposed photoresist composition.

In another embodiment of the present invention, a method of forming a pattern on a photoresist is provided comprising the steps of: i) providing a photoresist composition comprising a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than the first wavelength, and the second photoresist Y is provided in the photoresist composition in an amount sufficient to enhance a characteristic mobility of the photoresist composition relative to a photoresist composition including only the first photoresist X; and ii) exposing the photoresist composition to a patterned light source configured to emit radiation at the first wavelength to form an exposed photoresist composition.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than the first wavelength; ii) exposing the layer of photoresist composition to a patterned light source configured to emit radiation at the first wavelength to form an exposed layer of photoresist composition; and iii) converting the exposed layer of photoresist composition and the semiconductor wafer to a patterned semiconductor wafer. The exposed layer of photoresist composition may be converted to a patterned semiconductor wafer comprising processing steps of: i) baking the semiconductor wafer and the exposed layer of photoresist composition; ii) developing the exposed layer of photoresist composition; iii) etching the semiconductor wafer; and iv) removing the exposed layer of photoresist composition. The method may further comprise the step of inspecting the layer of photoresist composition following the developing the exposed layer of photoresist composition.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption of about 248 nm, and the second photoresist Y is characterized by an absorption spectrum exhibiting an operational absorption of about 193 nm; ii) exposing the layer of photoresist composition to a patterned light source configured to emit radiation at about 248 nm to form an exposed layer of photoresist composition; and iii) converting the exposed layer of photoresist composition and the semiconductor wafer to a patterned semiconductor wafer.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption of about 193 nm, and the second photoresist Y is characterized by an absorption spectrum exhibiting an operational absorption of about 157 nm; ii) exposing the layer of photoresist composition to a patterned light source configured to emit radiation at about 193 nm to form an exposed layer of photoresist composition; and iii) converting the exposed layer of photoresist composition and the semiconductor wafer to a patterned semiconductor wafer.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature by an amount sufficient to enhance a characteristic mobility of the photoresist composition relative to a photoresist composition including only the first photoresist X, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, and the second wavelength is substantially shorter than said first wavelength; ii) exposing the layer of photoresist composition to a patterned light source configured to emit radiation at the first wavelength to form an exposed layer of photoresist composition; and iii) converting the exposed layer of photoresist composition and the semiconductor wafer to a patterned semiconductor wafer.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature, the second photoresist Y is characterized by a second glass transition temperature, the second glass transition temperature is lower than the first glass transition temperature, the first photoresist X is characterized by an absorption spectrum exhibiting an operational absorption in the vicinity of a first wavelength, the second photoresist Y is characterized by an absorption spectrum exhibiting an operational absorption in the vicinity of a second wavelength, the second wavelength is substantially shorter than said first wavelength, and the second photoresist Y is provided in the photoresist composition in an amount sufficient to enhance a characteristic mobility of the photoresist composition relative to a photoresist composition including only the first photoresist X; ii) exposing the layer of photoresist composition to a patterned light source configured to emit radiation at the first wavelength to form an exposed layer of photoresist composition; and iii) converting the exposed layer of photoresist composition and the semiconductor wafer to a patterned semiconductor wafer.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature of about 130° C., the second photoresist Y is characterized by a second glass transition temperature of about 100° C., the first photoresist X is characterized by an absorption spectrum exhibiting an operational absorption of about 248 nm, and the second photoresist Y is characterized by an absorption spectrum exhibiting an operational absorption of about 193 nm; ii) exposing the layer of photoresist composition to a patterned light source configured to emit radiation at about 248 nm to form an exposed layer of photoresist composition; iii) baking the semiconductor wafer and the exposed layer of photoresist composition at a temperature between about 100° C. and about 160° C.; iv) developing the exposed layer of photoresist composition v) etching the semiconductor wafer, removing the exposed layer of photoresist composition; and vi) inspecting the layer of photoresist composition following said developing the exposed layer of photoresist composition.

In another embodiment of the present invention, a method of forming a patterned semiconductor wafer is provided comprising the steps of: i) providing a semiconductor wafer, depositing a layer of photoresist composition on the semiconductor wafer, wherein the layer of photoresist composition comprises a combination of a first photoresist X and a second photoresist Y, wherein the first photoresist X is characterized by a first glass transition temperature of about 150° C., the second photoresist Y is characterized by a second glass transition temperature of about 100° C., the first photoresist X is characterized by an absorption spectrum exhibiting an operational absorption of about 193 nm, the second photoresist Y is characterized by an absorption spectrum exhibiting an operational absorption of about 157 nm; ii) exposing the layer of photoresist composition to a patterned light source configured to emit radiation at about 193 nm to form an exposed layer of photoresist composition; iii) baking the semiconductor wafer and the exposed layer of photoresist composition at a temperature between about 100° C. and about 160° C.; iv) developing the exposed layer of photoresist composition; v) etching the semiconductor wafer; vi) removing the exposed layer of photoresist composition; and vii) inspecting the layer of photoresist composition following the developing the exposed layer of photoresist composition.

In another embodiment of the present invention, a method of forming a patterned semiconductor wafer is provided comprising the steps of: i) providing a semiconductor wafer; ii) forming layer of photoresist composition on said semiconductor wafer, wherein said layer of photoresist composition is formed by depositing a layer of a first photoresist X on said semiconductor wafer and depositing a layer of a second photoresist Y on said semiconductor wafer, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength; ii) exposing said layer of photoresist composition to a patterned light source configured to emit radiation at said first wavelength to form an exposed layer of photoresist composition; and iii) converting said exposed layer of photoresist composition and said semiconductor wafer to a patterned semiconductor wafer. The exposed layer of photoresist composition is converted to a patterned semiconductor wafer by processing steps comprising i) baking said semiconductor wafer and said exposed layer of photoresist composition; ii) developing said exposed layer of photoresist composition; iii) etching said semiconductor wafer; and iv) removing said exposed layer of photoresist composition. The method further comprises inspecting said layer of photoresist composition following said developing said exposed layer of photoresist composition.

Accordingly, it is an object of the present invention to provide an improved photoresist composition and its method of formation, a resist exposure system utilizing the improved photoresist, a method of forming a pattern on the improved photoresist, a method of forming a patterned semiconductor wafer, and a patterned semiconductor wafer formed in a process utilizing the improved photoresist.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
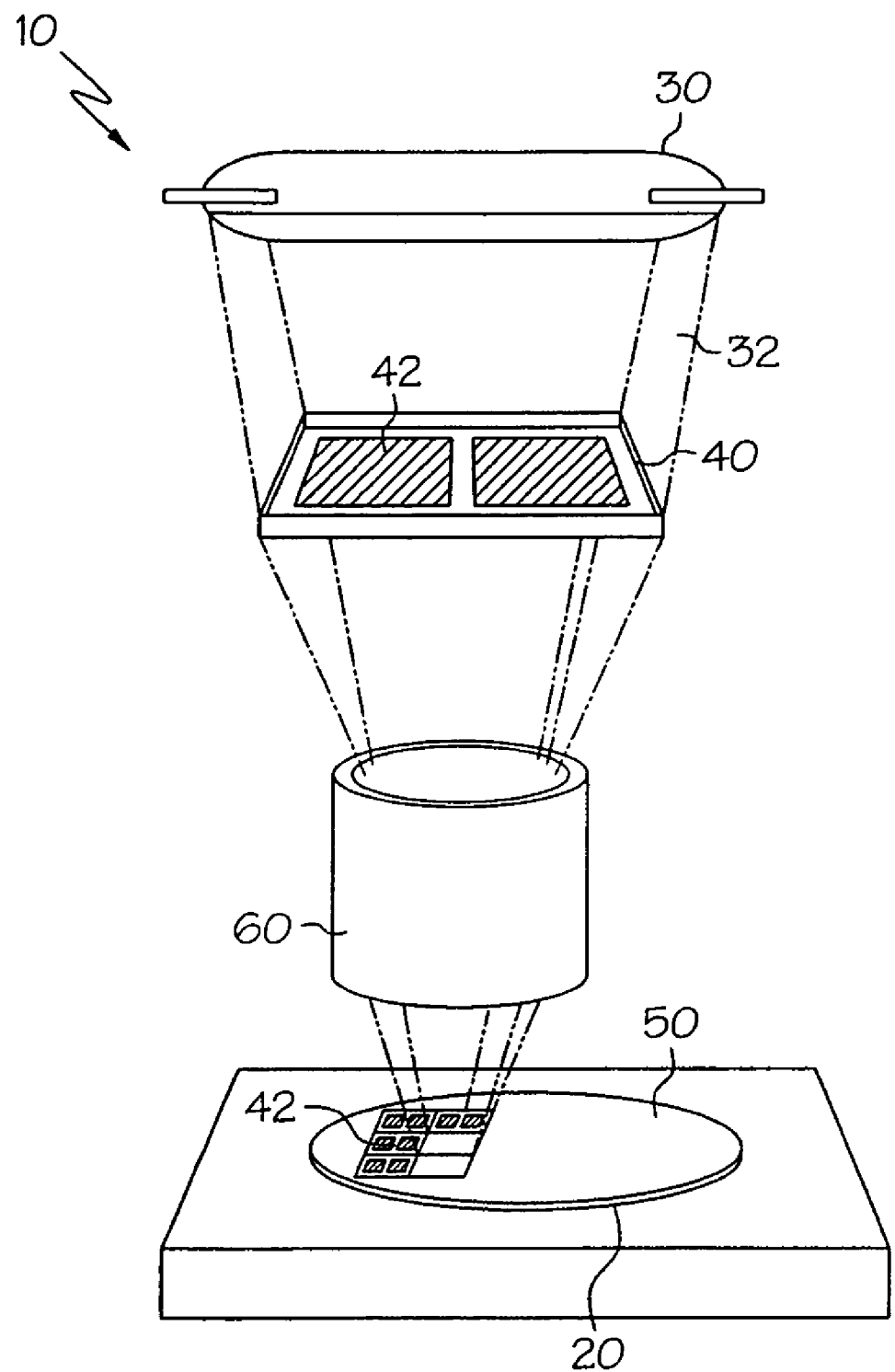
FIG. 1 is an illustration of a resist exposure system corresponding with one embodiment of the present invention.

The photoresist composition of the present invention comprises a combination of a first photoresist X and a second photoresist Y. First photoresist X is characterized by a first glass transition temperature and by an absorption spectrum exhibiting an operational absorption in the vicinity of a first wavelength. Second photoresist Y is characterized by a second glass transition temperature and by an absorption spectrum exhibiting an operational absorption in the vicinity of a second wavelength. By "operational wavelength" we mean that the photoresist exhibits an absorption that is high enough to allow the photoresist to function as a resist at the wavelength. For example, the absorption of a 157 photoresist is typically not sufficient to absorb at 193 nm and allow the photoresist to operate at 193 nm. As a further example, the absorption of a 193 photoresist is typically not sufficient to absorb at 157 nm and allow the photoresist to operate at 157 nm. The second wavelength is substantially shorter than the first wavelength. The second glass transition temperature is lower than the first glass transition temperature.

The amount of second photoresist Y that is combined with first photoresist X is an amount sufficient to enhance a characteristic mobility of the photoresist composition relative to a photoresist composition including only the first photoresist X. By "characteristic mobility" we mean the degree to which molecules of the photoresist composition move at a given temperature. By enhancing the characteristic mobility, certain embodiments of the present invention help reduce surface wave, or standing wave, and sidewall roughness commonly associated with lithographic processes. It is to be appreciated that the composition of the present invention is not limited to this specific advantage.

For example, in one embodiment of the present invention, first photoresist X is selected such that it exhibits an operational absorption in the vicinity of 248 nm—the operating wavelength of a common lithography tool. Second photoresist Y is selected such that it exhibits an operational absorption in the vicinity of 193 nm—the operating wavelength of another common lithography tool. Typically, the amount of photoresist Y added to photoresist X is such that the photoresist composition exhibits an operational absorption in the vicinity of the first wavelength, in this embodiment about 248 nm. It is to be appreciated that the operational absorption of the photoresist composition is not required to be in the vicinity of the first wavelength. Thus, the photoresist composition of the present invention is suitable for use with a lithography tool that operates at a wavelength of about 248 nm. By selecting the photoresists in this manner, one practicing the present invention can be sure to have a readily available source for both types of photoresists, although the present invention is not limited to the use of only readily available photoresists.

In another embodiment of the present invention, first photoresist X is selected such that it exhibits an operational absorption in the vicinity of 193 nm—the operating wavelength of a common lithography tool. Second photoresist Y is selected such that it exhibits an operational absorption in the vicinity of 157 nm—the operating wavelength of another common lithography tool. Typically, the amount of photoresist Y added to photoresist X is such that the photoresist composition exhibits an operational absorption in the vicinity of the first wavelength, in this embodiment about 193 nm. It is to be appreciated that the operational absorption of the photoresist composition is not required to be in the vicinity of the first wavelength. Thus, the photoresist composition of the present invention is suitable for use with a lithography tool that operates at a wavelength of about 193 nm. By selecting the photoresists in this manner, one practicing the present invention can be sure to have a readily available source for both types of photoresists, although the present invention is not limited to the use of only readily available photoresists.

Generally, the photoresist composition comprises about 50 wt. % to about 90 wt. % of the first photoresist X and about 10 wt. % to about 50 wt. % of the second photoresist Y. Typically, the photoresist composition comprises about 90 wt. % of the first photoresist X and about 10 wt. % of the second photoresist Y. In specific embodiments of the present invention, the photoresist composition comprises about 80 wt. % of the first photoresist X and about 20 wt. % of the second photoresist Y or about 60 wt. % of the first photoresist X and about 40 wt. % of the second photoresist Y.

"Glass transition temperature" ($T_G$) can be defined as the temperature point where the photoresist composition experiences a significant change in properties, such as a change in elasticity or loss of stiffness, turning 'rubbery' upon heating and 'glassy' upon cooling. Typically, the first glass transition temperature is greater than 130° C. or, more specifically, between about 130° C. and about 200° C. The second glass transition temperature is lower than the first glass transition temperature by an amount sufficient to enhance the characteristic mobility of the photoresist composition relative to a photoresist composition including only the first photoresist X. Typically, the second glass transition temperature is lower than the first glass transition temperature by about 50° C. The second glass transition temperature is greater than 80° C. or, more specifically, can be between about 80° C. and about 130° C.

Typically, the photoresist composition is polymeric. The photoresist composition can be used for negative photoresists and positive photoresists. While deep ultra-violet absorbencies are discussed, it is appreciated that the photoresist composition can be made to absorb at frequencies that are other than deep ultra-violet, for example 436 nm, 405 nm, and 365 nm.

Referring now to FIG. 1, a resist exposure system 10 is shown. The resist exposure system 10 comprises a semiconductor wafer 20, an exposure source 30, and a mask 40. A layer of the photoresist composition 50 described above, is formed over the semiconductor wafer 20. The layer of photoresist composition 50 is formed over the semiconductor wafer 20 by any suitable method. Radiation 32 is emitted from the exposure source 30 and passes through the mask 40. The mask 40 is positioned between the exposure source 30 and the layer of photoresist resist composition 50. The mask 40 defines an exposure pattern image 42 which is transposed onto the photoresist composition 50 as the radiation 32 passes through the mask 40. The exposure pattern 42 includes portions that have relatively high transmission at the first wavelength and portions that have a relatively low transmission at the first wavelength. The specific portions are not labeled in FIG. 1 as the location of the portions may vary depending upon the desired type of photoresist that is used, i.e. positive photoresist or negative photoresist. The exposure system 10 may also comprise a lens 60 to reduce the size of the pattern image 34 that is transposed onto the photoresist composition 50.

The exposure source 30 comprises any suitable lithography source, for example, an excimer laser made from KrF with a wavelength of about 248 nm. It is to be appreciated that the exposure source will vary depending upon the maximum absorption of the photoresist composition. Thus, if the photoresist composition absorbs at 193 nm, the exposure source is preferably an excimer laser made from ArF with a wavelength of about 193 nm. Other possible exposure sources include an excimer laser made from $F_2$ with a wavelength of 157 nm, and a mercury arc lamp for emitting radiation around 365 nm, 405 nm, and 436 nm.

Referring to FIGS. 2A-2E, a method for making a patterned semiconductor wafer is shown. Specifically referring to FIG. 2A, a layer of photoresist composition 50 is deposited over a semiconductor wafer 20. The layer of photoresist composition 50 can be deposited by any suitable method. The photoresist composition 50 being the composition described above which comprises a first photoresist X and a second photoresist Y. The layer of photoresist composition 50 can be deposited over the semiconductor wafer 20 by first combining first photoresist X with second photoresist Y and then depositing the photoresist composition onto the semiconductor wafer 20. Alternatively, it is contemplated that the layer of photoresist composition 50 can also be deposited over the semiconductor wafer 20 by first depositing first photoresist X over the semiconductor wafer 20 and then depositing the second photoresist Y over the semiconductor wafer 20 and combining it with the first photoresist X, thereby forming a layer of photoresist composition 50 over the semiconductor wafer 20. By "over" we mean to include "on" and "above," where above may include intervening layers.

The layer of photoresist composition 50 and the semiconductor wafer 20 may be soft baked at a temperature between about 100° C. and about 160° C.

Figure 2A:
FIG. 2 is an illustration of a method for making a patterned semiconductor wafer according to the present invention.
Figure 2B:
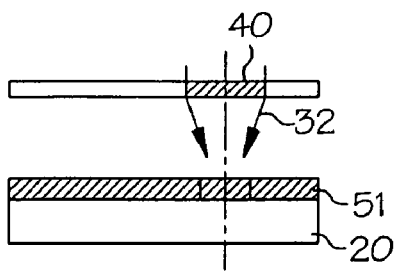
Figure 2C:
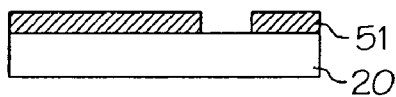
Figure 2D:
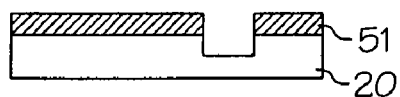
Figure 2E:

Referring to FIG. 2B, the layer of photoresist composition 50 is exposed to a light source (not shown) that is patterned by using a mask 40. The light source is configured to emit radiation 32 at a first wavelength. The radiation 32 passes through the mask 40 to form an exposed layer of photoresist composition 51. The semiconductor wafer 20 and the exposed layer of photoresist composition 51 may be post exposure baked at a temperature between 100° C. and about 150° C. Referring specifically to FIG. 2C, the exposed layer of photoresist composition 51 may be developed by any suitable means and is then inspected for imperfections. The semiconductor wafer 20 and the exposed layer of photoresist composition 51 may be hard baked at a temperature between 150° C. and about 250° C. Referring specifically to FIG. 2D, the semiconductor wafer 20 may be etched by any suitable etching methods, i.e. wet, facet, dry. Referring specifically to FIG. 2E, the exposed layer of photoresist composition 51 is then removed from the semiconductor wafer 20 thereby converting the semiconductor wafer to a patterned semiconductor wafer 35. The patterned semiconductor wafer 35 is then inspected for imperfections.

The photoresist composition of the present invention is described in more detail by way of the following example, which is intended to be illustrative of the invention, but not intended to be limiting in scope.

EXAMPLE

An MIL-02 Resist (comprised of acrylate or substituted acrylate polymers or copolymers), available from Tokyo Ohka of Japan, which absorbs at 193 nm is mixed with a PEK-500 Resist (substituted styrene polymers or copolymers), available from Sumitomo Chemical of Japan, which absorbs at 248 nm at a 1:5 ratio to form a mixture resist composition. The photoresist composition is soft baked for 60 seconds at 110° C. The mixture resist composition is deposited, exposed, baked at 120° C. for 60 seconds and developed. Processing results show that the side walls of the photoresist composition are less susceptible to standing wave roughness.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of forming a pattern on a photoresist:
providing a photoresist composition comprising a combination of a first photoresist X and a second photoresist Y, wherein
said first photoresist X is characterized by a first glass transition temperature,
said second photoresist Y is characterized by a second glass transition temperature,
said second glass transition temperature is lower than said first glass transition temperature,
said first photoresist X is characterized by an absorption spectrum exhibiting an operational absorption in the vicinity of a first wavelength,
said second photoresist Y is characterized by an absorption spectrum exhibiting an operational absorption in the vicinity of a second wavelength, and
said second wavelength is substantially shorter than said first wavelength; and
exposing said photoresist composition to a patterned light source configured to emit radiation at said first wavelength to form an exposed photoresist composition.

2. A method of forming a pattern on a photoresist:
providing a photoresist composition comprising a combination of a first photoresist X and a second photoresist Y, wherein
said first photoresist X is characterized by a first glass transition temperature,
said second photoresist Y is characterized by a second glass transition temperature,
said second glass transition temperature is lower than said first glass transition temperature,
said first photoresist X is characterized by an absorption spectrum exhibiting an operational absorption of about 248 nm, and
said second photoresist Y is characterized by an absorption spectrum exhibiting an operational absorption of about 193 nm; and
exposing said photoresist composition to a patterned light source configured to emit radiation at about 248 nm to form an exposed photoresist composition.

3. A method of forming a pattern on a photoresist:
providing a photoresist composition comprising a combination of a first photoresist X and a second photoresist Y, wherein
said first photoresist X is characterized by a first glass transition temperature,
said second photoresist Y is characterized by a second glass transition temperature,
said second glass transition temperature is lower than said first glass transition temperature, said first photoresist X is characterized by an absorption spectrum exhibiting an operational absorption of about 193 nm, and said second photoresist Y is characterized by an absorption spectrum exhibiting an operational absorption of about 157 nm; and exposing said photoresist composition to a patterned light source configured to emit radiation at about 193 nm to form an exposed photoresist composition.

4. A method of forming a pattern on a photoresist:

providing a photoresist composition comprising a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature by an amount sufficient to enhance a characteristic mobility of said photoresist composition relative to a photoresist composition including only said first photoresist X, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength; and exposing said photoresist composition to a patterned light source configured to emit radiation at said first wavelength to form an exposed photoresist composition.

5. A method of forming a pattern on a photoresist:

providing a photoresist composition comprising a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength, and said second photoresist Y is provided in said photoresist composition in an amount sufficient to enhance a characteristic mobility of said photoresist composition relative to a photoresist composition including only said first photoresist X; and exposing said photoresist composition to a patterned light source configured to emit radiation at said first wavelength to form an exposed photoresist composition.

6. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength;

exposing said layer of photoresist composition to a patterned light source configured to emit radiation at said first wavelength to form an exposed layer of photoresist composition; and converting said exposed layer of photoresist composition and said semiconductor wafer to a patterned semiconductor wafer.

7. The method as claimed in claim 6, wherein said exposed layer of photoresist composition is converted to a patterned semiconductor wafer by processing steps comprising:

developing said exposed layer of photoresist composition;

baking said semiconductor wafer and said exposed layer of photoresist composition;

etching said semiconductor wafer; and removing said exposed layer of photoresist composition.

8. The method as claimed in claim 7, wherein said method further comprises inspecting said layer of photoresist composition following said developing said exposed layer of photoresist composition.

9. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption of about 248 nm, and said second photoresist Y is characterized by an absorption spectrum exhibiting an operational absorption of about 193 nm;

exposing said layer of photoresist composition to a patterned light source configured to emit radiation at about 248 nm to form an exposed layer of photoresist composition; and converting said exposed layer of photoresist composition and said semiconductor wafer to a patterned semiconductor wafer.

10. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption of about 193 nm, and said second photoresist Y is characterized by an absorption spectrum exhibiting an operational absorption of about 157 nm;

exposing said layer of photoresist composition to a patterned light source configured to emit radiation at about 193 nm to form an exposed layer of photoresist composition; and converting said exposed layer of photoresist composition and said semiconductor wafer to a patterned semiconductor wafer.

11. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature by an amount sufficient to enhance a characteristic mobility of said photoresist composition relative to a photoresist composition including only said first photoresist X, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength;

exposing said layer of photoresist composition to a patterned light source configured to emit radiation at said first wavelength to form an exposed layer of photoresist composition; and converting said exposed layer of photoresist composition and said semiconductor wafer to a patterned semiconductor wafer.

12. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, said second wavelength is substantially shorter than said first wavelength, and said second photoresist Y is provided in said photoresist composition in an amount sufficient to enhance a characteristic mobility of said photoresist composition relative to a photoresist composition including only said first photoresist X;

exposing said layer of photoresist composition to a patterned light source configured to emit radiation at said first wavelength to form an exposed layer of photoresist composition; and converting said exposed layer of photoresist composition and said semiconductor wafer to a patterned semiconductor wafer.

13. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature of about 150° C., said second photoresist Y is characterized by a second glass transition temperature of about 100° C., said first photoresist X is characterized by an absorption spectrum exhibiting an operational absorption of about 248 nm, and said second photoresist Y is characterized by an absorption spectrum exhibiting an operational absorption of about 193 nm;

baking said semiconductor wafer and said layer of photoresist composition at a temperature between about 100° C. and about 160° C.;

exposing said layer of photoresist composition to a patterned light source configured to emit radiation at about 248 nm to form an exposed layer of photoresist composition;

baking said semiconductor wafer and said exposed layer of photoresist composition at a temperature between about 100° C. and about 160° C.;

developing said exposed layer of photoresist composition;

etching said semiconductor wafer;

baking said semiconductor wafer and said exposed layer of photoresist composition at a temperature between about 150° C. and 250° C.;

removing said exposed layer of photoresist composition; and inspecting said layer of photoresist composition following said developing said exposed layer of photoresist composition.

14. A method of forming a patterned semiconductor wafer comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature of about 150° C., said second photoresist Y is characterized by a second glass transition temperature of about 100° C., said first photoresist X is characterized by an absorption spectrum exhibiting an operational absorption of about 193 nm, said second photoresist Y is characterized by an absorption spectrum exhibiting an operational absorption of about 157 nm;

exposing said layer of photoresist composition to a patterned light source configured to emit radiation at about 193 nm to form an exposed layer of photoresist composition;

baking said semiconductor wafer and said exposed layer of photoresist composition at a temperature between about 100° C. and about 160° C.;

developing said exposed layer of photoresist composition;

etching said semiconductor wafer;

removing said exposed layer of photoresist composition; and inspecting said layer of photoresist composition following said developing said exposed layer of photoresist composition.

15. A method of forming a patterned semiconductor wafer comprising:

providing a semiconductor wafer;

forming layer of photoresist composition on said semiconductor wafer, wherein said layer of photoresist composition is formed by depositing a layer of a first photoresist X on said semiconductor wafer and depositing a layer of a second photoresist Y on said semiconductor wafer, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength;

exposing said layer of photoresist composition to a patterned light source configured to emit radiation at said first wavelength to form an exposed layer of photoresist composition; and converting said exposed layer of photoresist composition and said semiconductor wafer to a patterned semiconductor wafer.

16. The method as claimed in claim 15, wherein said exposed layer of photoresist composition is converted to a patterned semiconductor wafer by processing steps comprising:

baking said semiconductor wafer and said exposed layer of photoresist composition;

developing said exposed layer of photoresist composition;

etching said semiconductor wafer; and removing said exposed layer of photoresist composition.

17. The method as claimed in claim 16, wherein said method further comprises inspecting said layer of photoresist composition following said developing said exposed layer of photoresist composition.

18. A patterned semiconductor wafer formed by a process comprising:

providing a semiconductor wafer;

depositing a layer of photoresist composition on said semiconductor wafer, wherein said layer of photoresist composition comprises a combination of a first photoresist X and a second photoresist Y, wherein said first photoresist X is characterized by a first glass transition temperature, said second photoresist Y is characterized by a second glass transition temperature, said second glass transition temperature is lower than said first glass transition temperature, said first photoresist X is characterized by an absorption spectrum exhibiting an operational absorption in the vicinity of a first wavelength, said second photoresist Y is characterized by an absorption spectrum exhibiting an operational absorption in the vicinity of a second wavelength, and said second wavelength is substantially shorter than said first wavelength;

exposing said layer of photoresist composition to a patterned light source configured to emit radiation at said first wavelength to form an exposed layer of photoresist composition; and converting said exposed layer of photoresist composition and said semiconductor wafer to a patterned semiconductor wafer.

* * * * *